United States Patent
Ruile et al.

(10) Patent No.: US 7,459,991 B2
(45) Date of Patent: Dec. 2, 2008

(54) SAW COMPONENT HAVING AN IMPROVED TEMPERATURE COEFFICIENT

(75) Inventors: Werner Ruile, Munich (DE); Ulrike Roesler, Hebertshausen (DE); Ulrich Wolff, Munich (DE); Anton Leidl, Hohenbrunn (DE); Gerd Scholl, Munich (DE); Markus Hauser, Feldafing (DE); Ulrich Knauer, Munich (DE)

(73) Assignee: Epcos AG, Munich (DE)

( * ) Notice: Subject to any disclaimer, the term of this patent is extended or adjusted under 35 U.S.C. 154(b) by 526 days.

(21) Appl. No.: 10/542,970

(22) PCT Filed: Dec. 16, 2003

(86) PCT No.: PCT/EP03/14350

§ 371 (c)(1),
(2), (4) Date: Aug. 24, 2005

(87) PCT Pub. No.: WO2004/066493

PCT Pub. Date: Aug. 5, 2004

(65) Prior Publication Data
US 2006/0103486 A1 May 18, 2006

(30) Foreign Application Priority Data
Jan. 23, 2003 (DE) .................. 103 02 633

(51) Int. Cl.
*H03H 9/72* (2006.01)
*H01L 41/083* (2006.01)

(52) U.S. Cl. .................. 333/133; 333/193; 310/346; 310/313 A; 310/313 B

(58) Field of Classification Search .............. 333/133; 310/346, 313 A, 313 B
See application file for complete search history.

(56) References Cited

U.S. PATENT DOCUMENTS

| 5,302,877 A | | 4/1994 | Sato et al. | |
| 5,631,612 A | * | 5/1997 | Satoh et al. | 333/193 |
| 6,667,673 B1 | * | 12/2003 | Strauss | 333/195 |
| 6,710,509 B1 | * | 3/2004 | Kadota | 310/313 A |

(Continued)

FOREIGN PATENT DOCUMENTS

DE 42 32 046 4/1993

(Continued)

OTHER PUBLICATIONS

David R. Lide, Ph.D, "CRC Handbook of Chemistry and Physics", 2005, Taylor & Francis Group, 86th Ed. p. 12-33.*

(Continued)

*Primary Examiner*—Robert Pascal
*Assistant Examiner*—Alan Wong
(74) *Attorney, Agent, or Firm*—Fish & Richardson P.C.

(57) ABSTRACT

An apparatus including a piezoelectric substrate having at least one transducer electrode structure. The structure having a metallization formed by one or more metals with a mean specific density that is at least 50% higher than that of aluminum. The structure having a compensation layer that is applied fully or partially over the metallization. The compensation layer is of a material having a temperature dependence of elastic constants that counteracts the temperature coefficient of frequency of the substrate. The compensation layer has a thickness that is less than 15% of an acoustic wavelength of a wave capable of propagation in the structure.

22 Claims, 3 Drawing Sheets

U.S. PATENT DOCUMENTS

| | | | |
|---|---|---|---|
| 6,791,237 B2 * | 9/2004 | Yamanouchi | 310/313 R |
| 6,900,709 B2 * | 5/2005 | Inoue | 333/193 |
| 7,034,433 B2 * | 4/2006 | Kadota et al. | 310/313 A |

FOREIGN PATENT DOCUMENTS

| | | |
|---|---|---|
| DE | 196 41 662 | 4/1997 |
| EP | 1 239 588 | 9/2002 |
| JP | 05-022067 | 1/1993 |

OTHER PUBLICATIONS

Ballandras et al., "Temperature derivatives fo the fundamental elastic constants of isotropic materials", Sep. 22, 1997, Appl. Phys. Lett. vol. 71, No. 12, p. 1625-1627.*

Ellipsometer data table, Oct. 1999, http://ece-www.colorado.edu/~bart/book/ellipstb.htm.*

Yamanouchi et al "High Temperature Stable GHz-Range Low-Loss Wide Band Transducers and Filter Using SiO2/LiNbO3, LiTaO3", IEEE Transactions on Ultrasonics Ferroelectrics and Frequency Control, IEEE No. 3, May 1995, pp. 392-396 XP000511372.

T. Omori et al "SAW Reflection Characteristics of Cu Electrodes and their Application to SAW IF Devices", IEEE Ultrason. Symp. Proc 2002, to be published.

K. Asai, et al Experimental and Theoretical investigation for temperature Characteristics and Propagation Losses of SAW's on SiO2/Al/LiTaO3; IEEE Ultrason. Symp. Proc 2002, to be published.

K. Eda et al "Direct Bonding of Piezoelectric Materials and its Applications", IEEE Ultrason. Symp. Proc 2000, pp. 299-309, Published already, 2000.

Kiyoshi Nakamura, Ailie Tourlog Effect of a Ferroelectric Inversion Layer on the Temperature Characteristics of Sh-Type Surface Acoustic waves on 36 O Y-X LiTaO3 Substrates, IEEE Trans Ferroel. Freq. Ctrl. vol. 41, No. 6, Nov. 1994, pp. 872-875.

J. V. Knuuttila et al "BAW Radiation fomr LSAW Resonators on Lithium Tantalate", IEEE Ultrason. Symp. Proc. 2001 pp. 193-196.

* cited by examiner

SAW COMPONENT HAVING AN IMPROVED TEMPERATURE COEFFICIENT

TECHNICAL FIELD

The invention relates to an SAW component (Surface Acoustic Wave component) which is assembled on a piezoelectric substrate, on which component structures are formed which comprise at least one inter-digital transducer for generating an SAW with the propagation velocity $V_{SAW}$, wherein the slower shear wave with a propagation velocity $V_{SSW}$ can also occur in the piezoelectric substrate.

BACKGROUND

SAW components are assembled on piezoelectric substrates, mono-crystalline wafers being preferred, due to their favorable piezoelectric characteristics. The piezoelectric characteristics as well as a number of other characteristics, such as the propagation velocity of acoustic waves in the wafer, is dependent upon the orientation of the wafer surface relative to the crystal axes of the piezoelectric mono-crystal. Through suitable choice of the crystal cut, wafers can be made available in this manner whose cut-dependent characteristics support the desired performance of the SAW component.

Wafers with cut angles that support the effective generation and low-loss propagation of surface-proximate acoustic waves are normally used for SAW components. These include, for example, quartz wafers with an ST cut, lithium niobate wafers with a rot YX cut of ca. 40-65°, and lithium tantalite with a cut angle of intersection rot YX of 36 to 46°. In the case of most components on substrates having the cut angles indicated, a wave propagating into the bulk of the substrate is normally generated in addition to the SAW. Because the acoustic energy of such a wave cannot be used in the component, this results in transfer losses. For this reason, measures are necessary to minimize these losses. So far, however, the complete suppression of leakage wave losses has not been possible.

Another problem with substrates suitable for SAW components lies in the relatively high temperature coefficient of frequency. This refers to the temperature dependency of substrate characteristics, such as the propagation velocity of the surface wave. Ultimately, this also causes a temperature dependency of the center frequency of the component. Leakage wave substrates, when compared with quartz, exhibit a relatively high temperature coefficient of frequency TCF of ca. 40 ppm/K. To absorb this temperature coefficient of frequency, the bandwidth of SAW components produced thereon must be increased sufficiently so that the component and, in particular, an SAW filter can still fulfill the required specification.

The duplexer required for the US-PCS mobile wireless system is a filter application whose specifications place high demands on a component. Its specifications cannot be maintained with SAW components and/or substrate materials with the aforementioned high temperature coefficient of frequency. To this end, it would be necessary to reduce the temperature coefficient of frequency.

Various methods have already been proposed for reducing the temperature coefficient of frequency, each of which, however, is associated with another serious disadvantage.

Reversing the piezoelectric axis of the piezoelectric substrate on the surface of the wafer, thereby reducing the temperature coefficient of frequency, is known, for example, from an article by K. Nakamura and A. Tourlog, 'Effect of a ferroelectric inversion layer on the temperature characteristics of SH-type surface acoustic waves on 36°Y-X LiTaO3 substrates,' IEEE Trans. Ferroel. Freq. Ctrl. Vol. 41, No. 6, November 1994, pp. 872-875. The problem in this case, however, is the associated reduction in coupling, the difficulty in manufacturing and the limited reduction in the TCF to ca. 15 ppm/K.

Generating a thin lithium tantalate film on a wafer with lower temperature propagation is known from an article by K. Eda et al., 'Direct Bonding of piezoelectric materials and its applications,' IEEE Ultrason. Symp. Proc. 200, pp. 299-309. Because of the thermal distortion with the wafer, a component assembled thereon has a reduced temperature coefficient of frequency. A disadvantage worth noting in this context is that producing these substrate materials requires a complex technology, which generates high process complexity and, therefore, high costs.

Reducing the temperature coefficient of frequency of SAW components with an $SiO_2$ film applied onto the entire surface of the substrate and the metallization is known from an article by K. Asai, M. Hikita et al., 'Experimental and theoretical investigation for temperature characteristics and propagation losses of SAWs on $SiO_2$/Al/$LiTaO_3$,' IEEE Ultrason. Symp. 2002 (to be published). In this context, however, it has come to light that the level of metallization must be substantially reduced in comparison to conventional SAW components. This results in increased attenuation, because the finger resistance in the transducers increases with reduced layer thickness. In addition, this method for reducing the temperature coefficient of frequency requires a very high layer thickness of the $SiO_2$ film of approx. 20% h/λ (that is, relative to the wavelength of the SAW that can be propagated therein). For this reason, the quality of the $SiO_2$ layer is crucial to the extent of the reduction achieved in the temperature coefficient of frequency and the insertion loss to be accepted.

However, implementing a US-PCS duplexer as an SAW component is not easily achieved with any of the methods proposed here.

SUMMARY

For this reason, the object of the present invention is to specify an SAW component, which is assembled on a leakage wave substrate and has a low temperature coefficient of frequency with low losses.

This object is achieved, according to the invention, by an SAW component with the characteristics of claim 1. Advantageous embodiments of the invention follow from the additional claims.

The inventors have discovered a way of successfully suppressing the leakage wave losses and reducing the temperature coefficient of frequency by means of an additional synergistic measure. It was found that the development of leakage wave losses can be suppressed if the velocity of the surface wave and/or the SAW can be reduced to such an extent making it lie below the propagation velocity of the slow shear wave. This is achieved by sufficiently increasing the mass load by means of the metallization. This measure alone would increase the temperature coefficient of frequency. According to the invention, however, an additional compensation layer consisting of a material with low temperature dependency of the elastic coefficient is provided on the entire surface of the wave and the metallization applied to it. It was found that the SAW can be held in proximity to the substrate surface by means of a higher mass load. In the invention, this causes the SAW to propagate to a sufficient extent within the compensation layer and, as a result of the material properties of the compensation layer, experiences only a slight temperature dependency in its propagation behavior.

It is especially advantageous, in this regard, that only relatively small layer thicknesses are necessary to achieve both a mass load that is sufficiently increased in comparison with standard metallizations as well as for the compensation layer. The small layer thicknesses have the advantage that they are more easily controlled technologically, that they can be manufactured cost-effectively and that, in the combination of the two layers (metallizations with high mass load and compensation layer), they exhibit no negative effects on the component characteristics. As a result, an SAW component is obtained that, despite low insertion loss, has a sufficiently low temperature coefficient of frequency of, for example, less than 15 ppm/K. Such an SAW component structured as a filter is then, for example, also suitable for [use] as a duplexer for the US-PCS mobile wireless system.

To increase the mass load, a metallization with a higher specific weight than the aluminum normally used is used for the component structures and, in particular, for the transducer electrode (e.g., interdigital transducer). Preferably, a metallization is used whose mean density (averaged across all layers in a sandwich-type metallization structure) is at least 50% greater than that of aluminum.

Copper, molybdenum and tungsten have proven to be preferred electrode materials in this regard. For this reason, advantageous metallizations of the invention consist, in particular, of one of these metals, of an alloy consisting primarily of one or more of these metals, or of material layer combinations that contain layers of primarily one or several of the cited metals. On the basis of a metallization consisting almost exclusively of copper, the cited purpose is already achieved with a layer thickness corresponding to only about 10% h/λ (relative to the acoustic wavelength of the wave capable of propagation in the structure). This wavelength is not just dependent on one material, but rather on all materials of the structure and its dimensioning, that is, for example, on piezoelectric material, metallization and the compensation layer applied over the metallization. When compared with the 10% h/λ aluminum normally used, a metallization consisting of 10% h/λ Cu has the additional advantage that ohmic losses in the component can be reduced as a result of the high electric conductivity. In addition, Cu offers a high degree of resistance to acustomigration, so that it exhibits high power compatibility. Using a suitable process, Cu can also be produced as a quasi-unicrystalline layer, providing even more improvement with regard to conductivity and power compatibility.

If the mass load achieved in this regard is converted to the heavier metals Mo and W, the cited purpose is achieved with these metals with even smaller layer thicknesses.

Surprisingly, it has been shown that $SiO_2$ constitutes an especially suitable material for the compensation layer and, as a result of the correspondingly reversed temperature dependency of its elastic coefficients, a TCF with virtually 0 ppm/K can already be achieved with ca. 6% h/λ $SiO_2$. The advantage of a compensation layer consisting of $SiO_2$ is that it is easily applied and compatible with both the component and its production steps. It has been shown that an $SiO_2$ compensation layer with a layer thickness of only ca. 4 to 8% h/λ is sufficient for suitable temperature coefficient of frequency compensation. This layer thickness is significantly smaller than the layer thickness of 20% h/λ proposed in the cited article by Asai et al., with which only the temperature coefficient of frequency is to be compensated. As a result, the thickness of the compensation layer is also smaller than the thickness of the metallization. The smaller layer thickness in the component of the invention is only possible because the SAW, as a result of the high mass load, can be pulled closer to the surface of the substrate, so that a thinner compensation layer already provides for sufficient reduction in the temperature coefficient of frequency.

A component of the invention is preferably assembled on a lithium tantalate substrate with a rotated profile, the preferred cut angles lying between 30 and 46° rot YX. Components on substrates with profiles selected in this manner exhibit especially favorable properties. In addition, the invention is especially advantageous with components assembled on such substrates.

A metallization preferably consisting primarily of copper was not previously used with SAW components due, on the one hand, to the associated high temperature coefficient of frequency occurring with high relative layer thicknesses and, on the other, to high corrosion sensitivity. Using the compensation layer of the invention, the latter problem of corrosion sensitivity is also successfully solved and the copper surfaces are protected against premature corrosion.

The adhesive strength of a metallization consisting primarily of copper can be improved with an adhesive layer additionally provided between the substrate and the metallization. Thin metal layers consisting, for example, of aluminum, molybdenum, nickel, titanium, tungsten or chromium are suitable for this purpose. Also suitable are multilayer adhesive layers or alloys of one or more of these metals, a total layer thickness of the adhesive layer of ca. 1 to 7 nm being sufficient. Adhesive layers with a thickness of 5 nm are generally sufficient.

The use of a copper as a metallization can be accompanied by increased production dispersion, which can be reduced, according to the invention, by a trimming process, which also results in an adjustment of the resonance frequency. To this end, the thickness of the compensation layer can varied across either the entire surface or parts of the surface during application, or it can be suitably etched following application. A dry etching process is preferably used when an $SiO_2$ layer is used as the compensation layer.

The quality of the $SiO_2$ layer also affects the properties of SAW components of the invention. This quality is primarily determined by the methods of application and the stoichiometry achieved as a result, especially with regard to the oxygen content of the $SiO_2$ layer. Layers of the composition $SiO_x$, where $1.9 \leq x \leq 2.1$, are especially suitable. $SiO_2$ layers characterized by a refractive index of between 1.43 and 1.49 are also highly suitable. Said layers can be produced to cover edges and be free of cavities by means, for example, of sputtering, a CVD process or a PVD process. This is also advantageous with respect to the aspects of process control and calculation of the parameters. It is advantageous to deposit the compensation layer and especially the $SiO_2$ layer at low temperatures. As a result, a compensation layer can be produced in which only minor intrinsic tensions prevail at room temperature.

A component of the invention having a copper metallization with a thickness of 10% h/λ, for example, an $SiO_2$ layer modified in the manner described above applied to it, and a layer thickness of 6% h/λ, for example, achieves a temperature coefficient of frequency of less than 15 ppm/K.

To further increase the corrosion resistance of the metallization, an additional, thin passivation layer, a thin aluminum oxide layer, for example, can be provided on top of the metallization. This can be applied directly by means of sputtering, for example, or, alternatively, by applying a thin aluminum layer and then converting it to the corresponding aluminum oxide by means of oxidation.

A thin gold layer on top of the copper also fulfills the corrosion resistance requirements, as well as serving as a starting point for an electrical connection to the exterior. In this connection, it is known that Au, especially as a basic material, is very well-suited for subsequent bumping.

An advantage of the invention, especially when the component (the chip) is installed in a housing or mounted on a module using the flip-chip method, is that the measures for reducing the TCF do not result in any differences in the structure, so that the standard methods can be used. No new resist or lithography processes are necessary, nor are deposition processes, wafer production processes or package technologies. The invention is independent of the component design and/or technology used for that purpose.

A component of the invention can, in particular, be structured as a DMS filter, which is already inherently characterized by low insertion loss. The invention can also be advantageously applied in the production of SPUDT filters (Single Phase Uni-Directional Transducer) as well as reactance and MPR filters (Multi-Port Resonator). Accordingly, the invention is also suitable for diplexers and duplexers, whose sub-filters correspond to one of said filter types. The invention is also well-suited for so-called 2-in-1 filters. A duplexer assembled using filters of the invention can, for the first time, satisfy the high standards for the US-PCS mobile wireless system, which was previously not yet possible with SAW filters.

In the following, the invention is explained in greater detail on the basis of exemplary embodiments and the corresponding figures. The figures are provided to improve comprehensibility and, therefore, are only schematic and are not true to scale.

DETAILED DESCRIPTION

Figure 1:
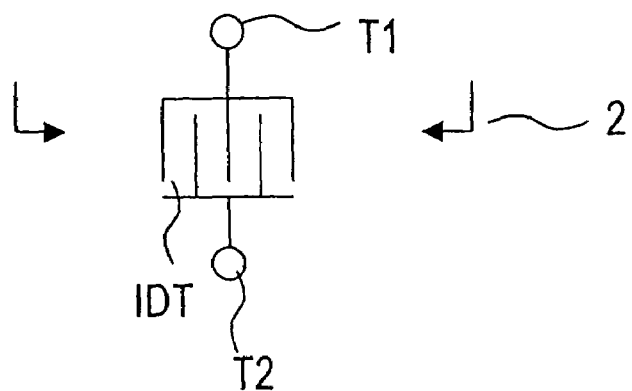
FIG. 1 shows an interdigital transducer, as an example of a metallization structure, in a top view

FIG. 1 shows, in a top view, an interdigital transducer IDT known in the art as an example of a metallization of a transducer electrode of an SAW component of the invention. This transducer is a key element of the SAW component and provides for the electro-acoustic conversion of a high-frequency electric signal, applied, for example, to terminals T1, T2, into a surface wave, or for the corresponding retro-conversion of the surface wave into an electric signal. The interdigital transducer IDT comprises at least two electrodes having virtually parallel electrode fingers EF, the fingers of the electrodes being interdigitally pushed into one another. Both electrodes can each be provided with an electric terminal T1, T2, at which an electric signal can be input or output, or which can be connected to ground.

Figure 2:
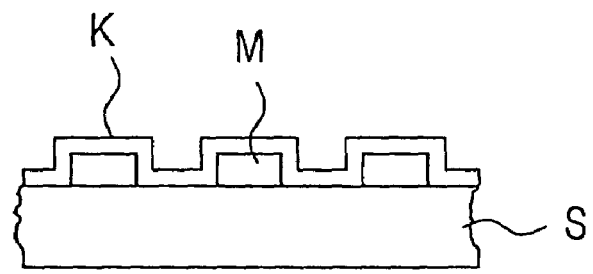
FIG. 2 shows the invention on the basis of a schematic cross-section through a metallization

FIG. 2 shows a component of the invention on the basis of a schematic cross-section along the intersecting line 2 shown in FIG. 1.

A metallization M, such as said interdigital transducer IDT, is applied onto the piezoelectric substrate, such as a lithium tantalate wafer with rot YX 39° cut. Here the metallization consists of pure copper or an alloy with a high copper content. The height $h_M$ of the metallization is adjusted, as a factor of the center frequency of the SAW component, to a value corresponding to ca. 10% of the wavelength of the acoustic wave capable of being propagated in the structure.

The metallization is, for example, deposited onto the entire surface by vacuum metallizing, sputtering, CVD or other processes, and then structured by means of lift-off technology. However, it is also possible to initially apply the metallization M onto the entire surface, then structuring it using an etching mask.

Once the metallization M. has been applied to the substrate S, in a structure as shown in FIG. 1, for example, a compensation layer K, preferably covering edges and in uniform layer thickness, is then applied to the entire surface. The layer thickness $h_K$ is adjusted, for example, to a value of 6% relative to the wavelength of the acoustic wave capable of propagation in this structure. As already mentioned, trimming can be done secondarily by means of back-etching.

In addition to the interdigital transducer shown in FIG. 1, the SAW component of the invention can comprise other metallization structures, which preferably all consist of the same material. The compensation layer K also preferably covers the entire surface of the substrate, with the exception of the electric terminal surfaces T1, T2 provided for contacting. The metallization can be additionally thickened on the electric terminal surfaces, on the connecting lines and on the current rails connecting the electrode fingers EF. This thickening can be achieved, for example, with a galvanic process, the metallization structures that are not to be thickened preferably being covered. Said compensation layer, which is structured accordingly prior to the galvanic step, can be used as covering. The electrical connection of the component to external contacts can then be achieved through bump connections or another solder connection, such as wire bonding.

Figure 3:
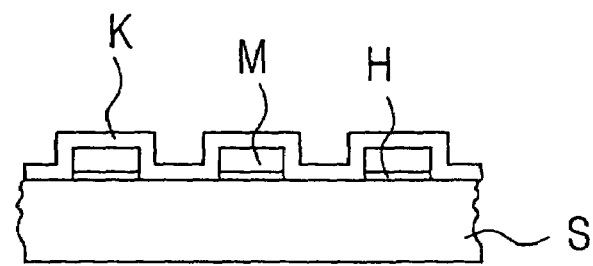
FIG. 3 shows a metallization with an additional adhesive layer

FIG. 3 shows another embodiment of the invention, in which a thin adhesive layer H having a thickness of 5 nm, for example, can be applied beneath the metallization M. Like the metallization M, the adhesive layer H can be applied to the entire surface and structured together with the metallization. An electrically conductive adhesive layer H can also be part of the metallization M. An electrically conductive adhesive layer H can also be part of the metallization M.

Figure 4:
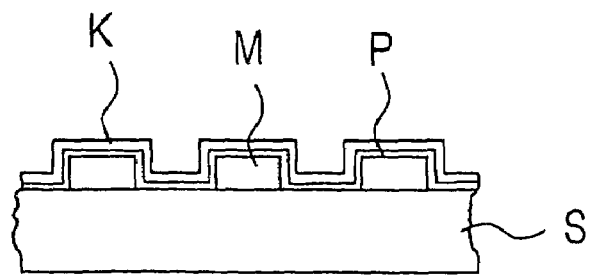
FIG. 4 shows a metallization with an additional passivation layer

FIG. 4 shows another embodiment of the invention, in which, following production of the metallization M, a thin passivation layer is initially applied to the entire surface of the metallization M and the interspaced exposed surface of the substrate S. Such a passivation layer P can also consist of any electrically conductive material, especially a dense oxide, nitride or carbide. A DLC layer (Diamond-Like Carbon) is also well-suited for this purpose. With such a passivation layer P, especially effective protection of the metallization M against corrosion, such as uncontrolled oxidation by atmospheric oxygen, is prevented. With such a passivation layer P, the compensation layer K can be formed to be less dense, because passivation of the electrode by the compensation layer is not necessary.

A thickness of a few nanometers, 5 to 10 nm, for example, is sufficient as the layer thickness of the passivation layer P.

Figure 5:
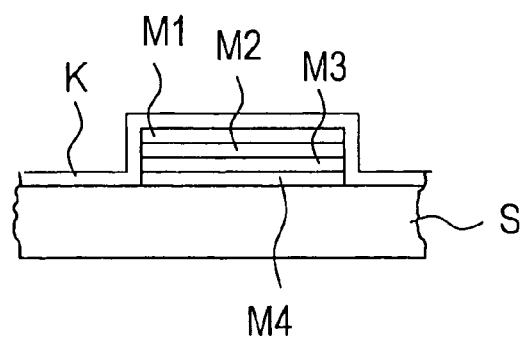
FIG. 5 shows a multilayer metallization

FIG. 5 shows another embodiment of the invention, in which a metallization M is used which is structured to be multi-layered. The figure, for example, shows a four-layer metallization structure with sub-layers M1, M2, M3 and M4. To increase the mass load of the metallization in accordance with the invention, at least one of these layers is made of a material with high specific density, wherein at least one of the remaining layers can consist of a conventional electrode material, that is, of aluminum or an alloy containing aluminum. Preferably, an alternating layer sequence comprising at least two layers is selected, at least one of said layers consisting of the metals Mo, Cu or W. The layer thicknesses of the metallization layers can be selected to be identical or different, wherein electric conductivity and, as a result, resistance, as well as mass load, can be adjusted by means of the suitable combination of various layer thicknesses. In this context, it is only necessary to ensure that at a correspondingly lower mass load, a correspondingly higher layer thickness $h_M$ of the metallization must be maintained. Here, as in all exemplary embodiments, an $SiO_2$ layer with a layer thickness of ca. 4 to 10% h/λ serves as compensation layer K over the metallization M.

Figure 6:
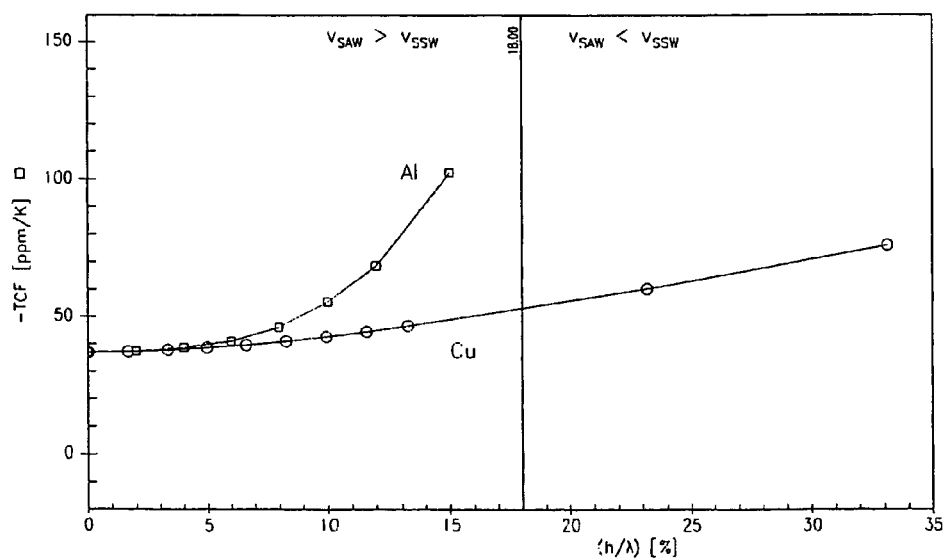
FIG. 6 shows the course of the temperature coefficient of frequency of metallizations consisting of Al and Cu, as a factor of the relative layer thickness of the metallization

FIG. 6 shows, on the basis of a simulation calculation, the effects of various metallizations (without compensation layer) on the temperature coefficient of frequency (TCF) of the resonant frequency. The diagram shows the simulated course of the TCF as a factor of the mass load, which is plotted along the x axis as the metallization height relative to aluminum $h_{M/Al}$. The different curves for the different metals Al and Cu were calculated here without a compensation layer. The metallization height is relative to aluminum and, in the case of high mass loads resulting from heavier metals, is reduced almost in proportion to the specific weight. The vertical division in the figure also indicates the limit for the mass load at which $V_{SAW} < V_{SSW}$. It becomes clear that this cannot be achieved with the known metallization made of aluminum.

Figure 7:
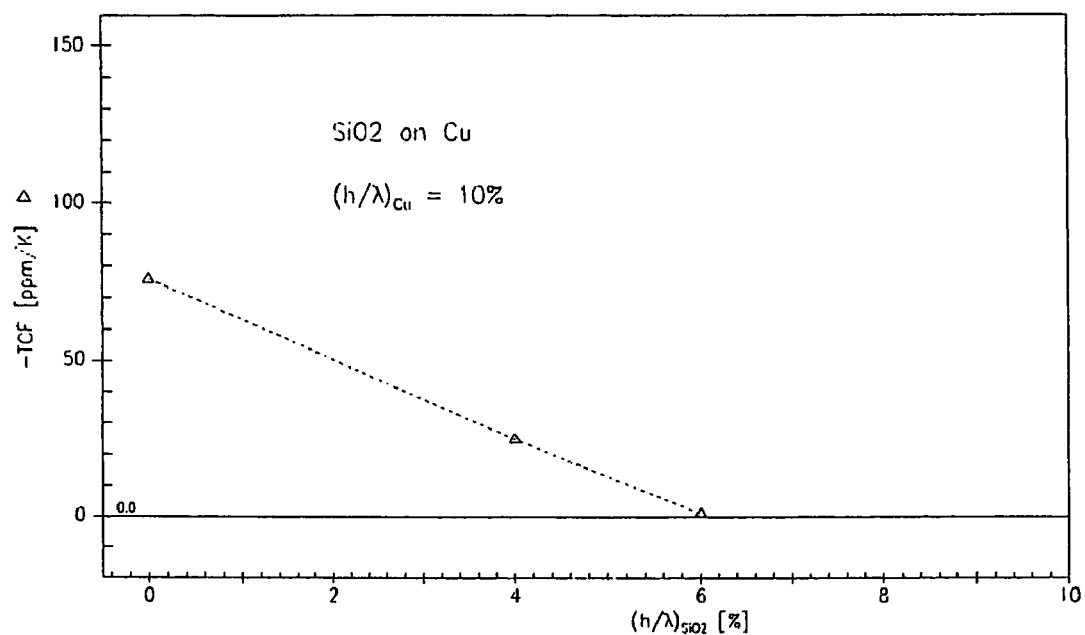
FIG. 7 shows the course of the temperature coefficient of frequency of a 10% Cu metallization, as a factor of the relative layer thickness of an $SiO_2$ layer as compensation layer

FIG. 7 shows, on the basis of a simulation calculation, the reduction in the temperature coefficient of frequency that can be achieved by applying an $SiO_2$ layer to a structured Cu structure of 10% h/λ. The first value (at the zero point on the x axis) is calculated for a structure that corresponds to the last value, with the highest mass load (for a Cu metallization), indicated in FIG. 6. It is evident that the relatively high TCF associated with the high mass load can be reduced to zero by means of the compensation layer, which is achieved, for the Cu structure of 10% h/λ on which the calculation is based, using an $SiO_2$ layer of 6% h/λ. A TCF of 0 is not achieved with a conventional Al metallization, even at minimal mass loads.

Even though the invention could only be described on the basis of a few exemplary embodiments, it is not limited to these. Combining the characteristics shown in the individual figures with one another also lies within the scope of the invention. Other variation options result from the selection of material, the layer thicknesses, the metallization structures and the types of components in which the invention can be used.

The invention claimed is:

1. An apparatus comprising:
   a piezoelectric substrate comprising at least one transducer electrode structure comprising:
      a metallization formed by one or more metals, the one or more metals having a mean specific density that is at least 50% higher than that of aluminum;
      a compensation layer applied fully or partially over the metallization, the compensation layer being of a material having a temperature dependence of elastic constants that substantially counteracts a temperature coefficient of frequency of the substrate, the compensation layer having a thickness that is less than 15% of an acoustic wavelength of a wave capable of propagation in the structure; and
      a passivation layer that is thinner than the compensation layer, the passivation layer being beneath the compensation layer.

2. The apparatus of claim 1, wherein the elastic constants of the metallization have less temperature dependency than elastic constants of aluminum.

3. The apparatus of claim 1, wherein the metallization comprises one or more of the following: copper, molybdenum, tungsten, gold, silver and platinum.

4. The apparatus of claim 1, wherein the compensation layer comprises $SiO_2$.

5. The apparatus of claim 1, wherein the metallization comprises copper or a copper alloy and has a thickness of 6 to 14% h/λ, where h is the thickness of the compensation layer and λ is the acoustic wavelength of a wave capable of propagation in the structure.

6. The apparatus of claim 1, wherein the compensation layer has a thickness of 4 to 10% h/λ, where h is the thickness of the compensation layer and λ is the acoustic wavelength of a wave capable of propagation in the structure.

7. The apparatus of claim 1, wherein the substrate comprises lithium tantalate with a rotated cut.

8. The apparatus of claim 1, wherein the substrate comprises lithium tantalate with a rotated cut and an angle of intersection of between 30 and 480°.

9. The apparatus of claim 1, wherein the substrate comprises lithium niobate.

10. The apparatus of claim 1, wherein the substrate comprises quartz.

11. The apparatus of claim 1, further comprising an adhesive layer beneath the metallization.

12. The apparatus of claim 11, wherein the adhesive layer comprises one or more of the following: aluminum, molybdenum, titanium, tungsten, chromium, and nickel.

13. The apparatus of claim 11, wherein the adhesive layer has a thickness of 1 to 7 nm.

14. The apparatus of claim 1, wherein the compensation layer comprises $SiO_2$ with a refractive index of between 1.43 and 1.49.

15. The apparatus of claim 1, wherein the temperature coefficient of frequency is less than 20 ppm/k.

16. The apparatus of claim 1, wherein the apparatus comprises a multiport filter.

17. The apparatus of claim 1, wherein the apparatus comprises a reactance filter.

18. The apparatus of claim 1, wherein the apparatus comprises a dual mode surface acoustic wave filter.

19. The apparatus of claim 1, wherein the apparatus comprises a single phase uni-directional transducer filter.

20. The apparatus of claim 1, wherein the apparatus comprises a duplexer.

21. The apparatus of claim 1, wherein the apparatus comprises a diplexer.

22. The apparatus of claim 1, wherein the apparatus comprises a 2-in-1 filter.

* * * * *

UNITED STATES PATENT AND TRADEMARK OFFICE
CERTIFICATE OF CORRECTION

| | |
|---|---|
| PATENT NO. | : 7,459,991 B2 |
| APPLICATION NO. | : 10/542970 |
| DATED | : December 2, 2008 |
| INVENTOR(S) | : Werner Ruile et al. |

It is certified that error appears in the above-identified patent and that said Letters Patent is hereby corrected as shown below:

Cover Page, Column 1, (75), inventors:, line 4, delete "Munich" and insert --Hamburg--.

In claim 8, column 8, line 31, delete "480°" and insert --48°--.

In claim 15, column 8, line 47, delete "ppm/k" and insert --ppm/K--.

Signed and Sealed this

Seventeenth Day of February, 2009

JOHN DOLL
*Acting Director of the United States Patent and Trademark Office*